US 10,211,032 B2

(12) United States Patent
Komatsu et al.

(10) Patent No.: US 10,211,032 B2
(45) Date of Patent: Feb. 19, 2019

(54) MICROWAVE PLASMA SOURCE AND PLASMA PROCESSING APPARATUS

(71) Applicant: TOKYO ELECTRON LIMITED, Minato-ku, Tokyo (JP)

(72) Inventors: Tomohito Komatsu, Nirasaki (JP); Taro Ikeda, Nirasaki (JP); Yutaka Fujino, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 413 days.

(21) Appl. No.: 14/566,117

(22) Filed: Dec. 10, 2014

(65) Prior Publication Data

US 2015/0170881 A1 Jun. 18, 2015

(30) Foreign Application Priority Data

Dec. 16, 2013 (JP) ................. 2013-259474

(51) Int. Cl.
| C23C 16/00 | (2006.01) |
| C23F 1/00 | (2006.01) |
| H01L 21/306 | (2006.01) |
| H01J 37/32 | (2006.01) |

(52) U.S. Cl.
CPC .... *H01J 37/32266* (2013.01); *H01J 37/3222* (2013.01); *H01J 37/32192* (2013.01); *H01J 37/32211* (2013.01); *H01J 37/32238* (2013.01)

(58) Field of Classification Search
USPC ...... 118/723 MW, 715–733, 723 R, 723 ME, 118/723 MR; 156/345.41, 345.42
See application file for complete search history.

(56) References Cited

U.S. PATENT DOCUMENTS

| 4,333,814 A | 6/1982 | Kuyel |
| 4,776,918 A | 10/1988 | Otsubo |
| 5,545,258 A | 8/1996 | Katayama |

(Continued)

FOREIGN PATENT DOCUMENTS

| CN | 101047118 A | 10/2007 |
| CN | 101371341 A | 2/2009 |

(Continued)

*Primary Examiner* — Rakesh K Dhingra
(74) *Attorney, Agent, or Firm* — Nath, Goldberg & Meyer; Jerald L. Meyer

(57) ABSTRACT

A microwave plasma source radiating a microwave in a chamber of a plasma processing apparatus to generate surface wave plasma includes a microwave output unit configured to generate and output a microwave, a microwave supply unit configured to transmit the microwave output from the microwave output unit, and a microwave radiation member configured as a ceiling wall of the chamber and configured to radiate the microwave supplied from the microwave supply unit into the chamber. The microwave supply unit includes microwave introduction mechanisms provided along a circumferential direction, thereby introducing the microwave to the microwave radiation member. The microwave radiation member includes slot antennas having slots through which the microwave is radiated and a microwave transmission member. The slots are provided to form a circular shape as a whole. The microwave transmission member provided to form a circular ring shape.

9 Claims, 13 Drawing Sheets

(56) References Cited

U.S. PATENT DOCUMENTS

| | | |
|---|---|---|
| 5,698,036 A | 12/1997 | Ishii |
| 6,245,192 B1 | 6/2001 | Dhindsa |
| 6,286,454 B1 | 9/2001 | Hirayama |
| 2005/0276928 A1 | 12/2005 | Okumura |
| 2007/0221623 A1 | 9/2007 | Horiguchi |
| 2007/0235425 A1 | 10/2007 | Oka |
| 2008/0053816 A1* | 3/2008 | Suzuki ............ H01J 37/32192 204/164 |
| 2009/0045749 A1 | 2/2009 | Ganachev |
| 2009/0074632 A1 | 3/2009 | Ishibashi |
| 2011/0174778 A1 | 7/2011 | Sawada |
| 2011/0271908 A1 | 11/2011 | Chang |
| 2012/0090782 A1* | 4/2012 | Ikeda ............... H01J 37/32293 156/345.28 |
| 2012/0222816 A1* | 9/2012 | Ikeda .................. C23C 16/274 156/345.41 |
| 2012/0247675 A1 | 10/2012 | Ikeda |
| 2013/0292047 A1 | 11/2013 | Tian |

FOREIGN PATENT DOCUMENTS

| | | |
|---|---|---|
| CN | 102655708 A | 9/2012 |
| CN | 102737947 A | 10/2012 |
| JP | 2002-299330 A | 10/2002 |
| JP | 2002-371367 A | 12/2002 |
| JP | 2003-188103 A | 7/2003 |
| JP | 2003-234327 A | 8/2003 |
| JP | 2005-196994 A | 7/2005 |
| JP | 2006-324551 A | 11/2006 |
| JP | 2010-087227 A | 4/2010 |
| KR | 10-2011-0032682 A | 3/2011 |
| KR | 10-2013-0095225 A | 8/2013 |
| WO | 2010/004997 A1 | 1/2010 |
| WO | 2013/089007 A1 | 6/2013 |

* cited by examiner

MICROWAVE PLASMA SOURCE AND PLASMA PROCESSING APPARATUS

CROSS-REFERENCE TO RELATED APPLICATION

This application claims the benefit of Japanese Patent Application No. 2013-259474, filed on Dec. 16, 2013, in the Japan Patent Office, the disclosure of which is incorporated herein in its entirety by reference.

TECHNICAL FIELD

The present disclosure relates to a microwave plasma source and a plasma processing apparatus.

BACKGROUND

Plasma processing is an essential technique for manufacturing semiconductor devices. In recent years, due to an increasing demand for high-integration and high-speed of LSI (Large-Scale Integration), design rules for semiconductor devices constituting LSI have changed to miniaturize the device, and semiconductor wafers have been enlarged in size. Accordingly, a plasma processing apparatus has been required to allow such miniaturization of semiconductor devices and enlargement of the semiconductor wafers.

However, in a conventional parallel plate type or inductively coupled plasma processing apparatus, it is difficult to perform uniform and high-speed plasma processing for semiconductor wafers.

In this regard, an RLSA (a registered trademark) microwave plasma processing apparatus has received attention. The RLSA microwave plasma processing apparatus uniformly generates high-density surface wave plasma having a low electron temperature.

The RLSA microwave plasma processing apparatus is provided with a radial line slot antenna, i.e., a planar slot antenna having a plurality of slots formed, with a predetermined pattern in the upper portion of a chamber as a microwave radiation antenna emitting microwaves for generating surface wave plasma. In the RLSA microwave plasma processing apparatus, the microwaves from a microwave source is guided to be radiated into a chamber kept at vacuum through the slots of antenna and a dielectric microwave transmission plate provided below the slots. By an electric field of the microwaves, surface wave plasma is generated in the chamber and target objects such as semiconductor wafers are processed by the plasma.

In such a RLSA microwave plasma apparatus, in order to adjust plasma distribution, a plurality of antennas different in slot shape, pattern and the like should be prepared for a replacement of the antenna. This preparation may be very troublesome.

In contrast, a plasma source has been disclosed in the related art in which one microwave is divided into a plurality of microwaves to and distributed to a plurality of microwave introduction mechanisms having a planar antenna as described above are installed. In the plasma source, the microwaves radiated therefrom are guided into a chamber and spatially synthesized in the chamber.

As the microwaves are spatially synthesized using the plurality of microwave introduction mechanisms, the microwave being introduced from each of the microwave introduction mechanisms can be individually adjusted in phase or amplitude and thus a plasma distribution can be relatively easily adjusted.

In addition, an arrangement of a plurality of microwave introduction mechanisms has been suggested to secure uniformity of a plasma distribution in the related art.

In the related art, a dielectric microwave transmission window (microwave transmission member) is installed in each microwave introduction mechanism of the ceiling wall of the chamber and the microwaves are radiated into the chamber through the microwave transmission window. In such a configuration, however, since the plasma is not sufficiently generated, a large number of microwave radiation units are needed in order to obtain uniform plasma.

SUMMARY

Some embodiments of the present disclosure provide a microwave plasma source and a plasma processing apparatus using the same, which enable plasma to be extensively generated, thereby generating uniform surface wave plasma even though the number of microwave radiation units is reduced.

According to one aspect of the present disclosure, there is provided a microwave plasma source that radiates a microwave in a chamber of a plasma processing apparatus to generate surface wave plasma, the microwave plasma source including a microwave output unit configured to generate and output a microwave, a microwave supply unit configured to transmit the microwave output from the microwave output unit, and a microwave radiation member configured as a ceiling wall of the chamber and configured to radiate the microwave supplied from the microwave supply unit into the chamber, wherein the microwave supply unit includes a plurality of microwave introduction mechanisms provided along a circumferential direction at positions on the microwave radiation member corresponding to a peripheral portion in the chamber, thereby introducing the microwave to the microwave radiation member, and wherein the microwave radiation member includes a plurality of slot antenna parts having slots through which the microwave is radiated, the slots being provided to form a circular shape as a whole along a microwave introduction mechanism arrangement region in which the microwave introduction mechanisms are arranged, and a microwave transmission member provided to form a circular ring shape in a position corresponding to the microwave introduction mechanism arrangement region to cover the slots and made of a dielectric material transmitting the microwave radiated from the slots.

According to another aspect of the present disclosure, there is provided a plasma processing apparatus, including a chamber configured to accommodate a substrate to be processed, a gas supply mechanism configured to supply a gas into the chamber, and a microwave plasma source configured to radiate a microwave in the chamber to generate surface wave plasma, wherein plasma processing is performed on the substrate to be processed by the surface wave plasma, wherein the microwave plasma source includes a microwave output unit configured to generate and output a microwave, a microwave supply unit configured to transmit the microwave output from the microwave output unit, and a microwave radiation member configured as a ceiling wall of the chamber and configured to radiate the microwave supplied from the microwave supply unit into the chamber, wherein the microwave supply unit includes a plurality of microwave introduction mechanisms provided along a circumferential direction at positions on the microwave radiation member corresponding to a peripheral portion in the chamber, thereby introducing the microwave to the microwave radiation member, and wherein the microwave radiation member includes a plurality of slot antenna parts having slots through which the microwave is radiated, the slots being provided to form a circular shape as a whole along a microwave introduction mechanism arrangement region in which the microwave introduction mechanisms are arranged, and a microwave transmission member provided to form a circular ring shape in a position corresponding to the microwave introduction mechanism arrangement region to cover the slots and made of a dielectric material transmitting the microwave radiated from the slots.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will now be described in detail with reference to the drawings.

<Configuration of Plasma Processing Apparatus>

Figure 1:
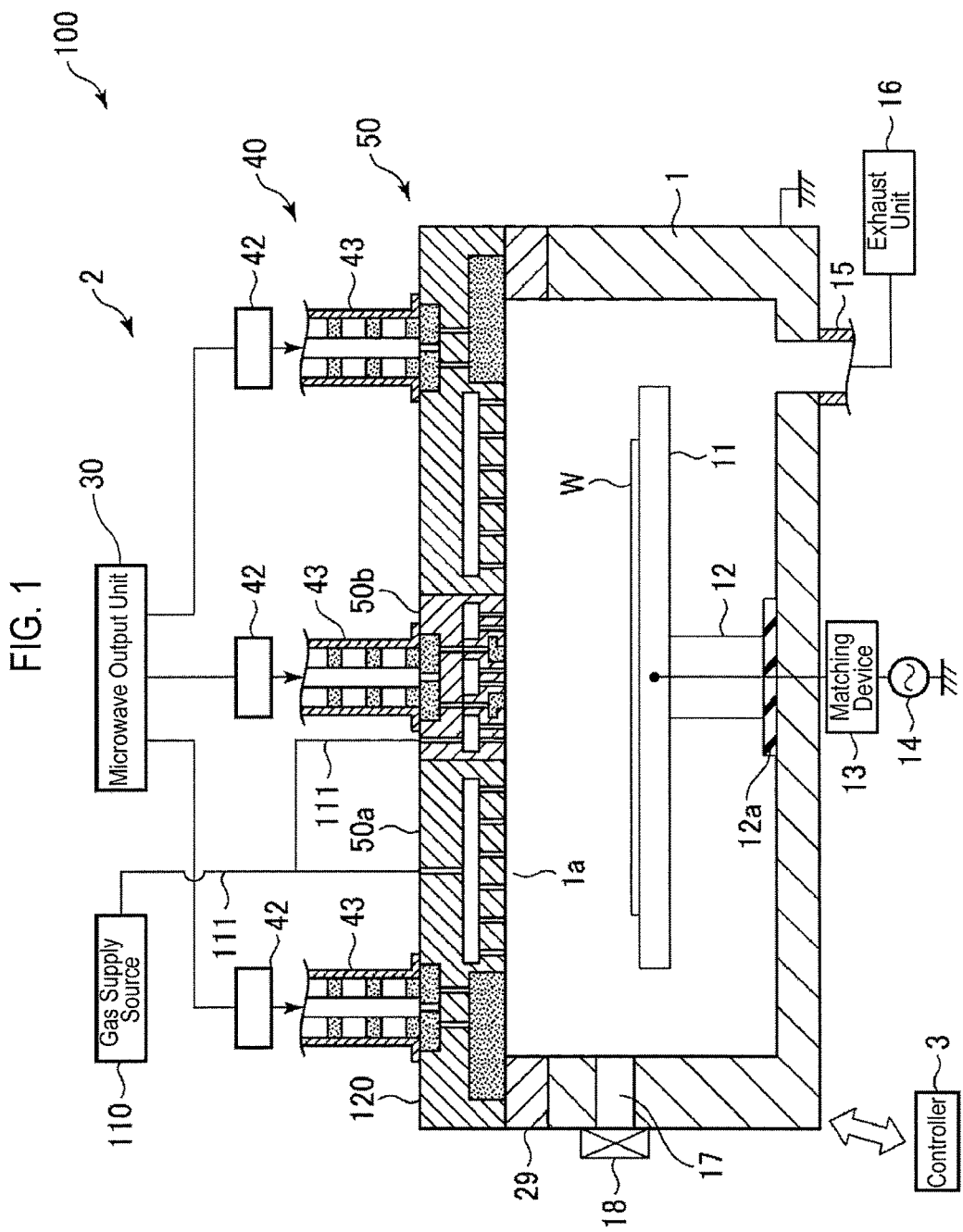
FIG. 1 is a sectional view showing a schematic configuration of a plasma processing apparatus according to one embodiment of the present disclosure.
Figure 2:
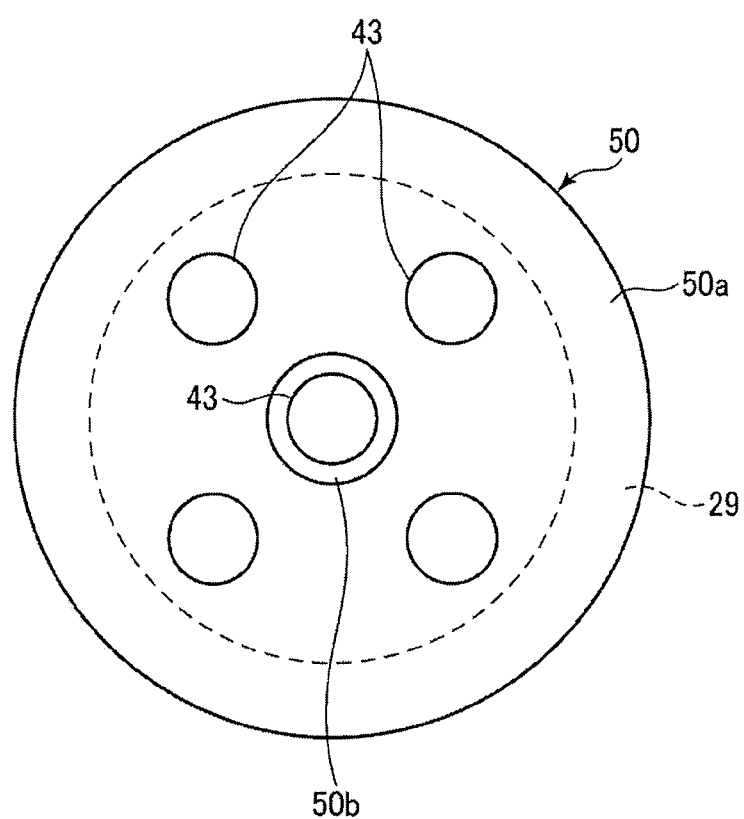
FIG. 2 is a plan view schematically showing a microwave introduction mechanism in a microwave plasma source used in the plasma processing apparatus of FIG. 1.
Figure 3:
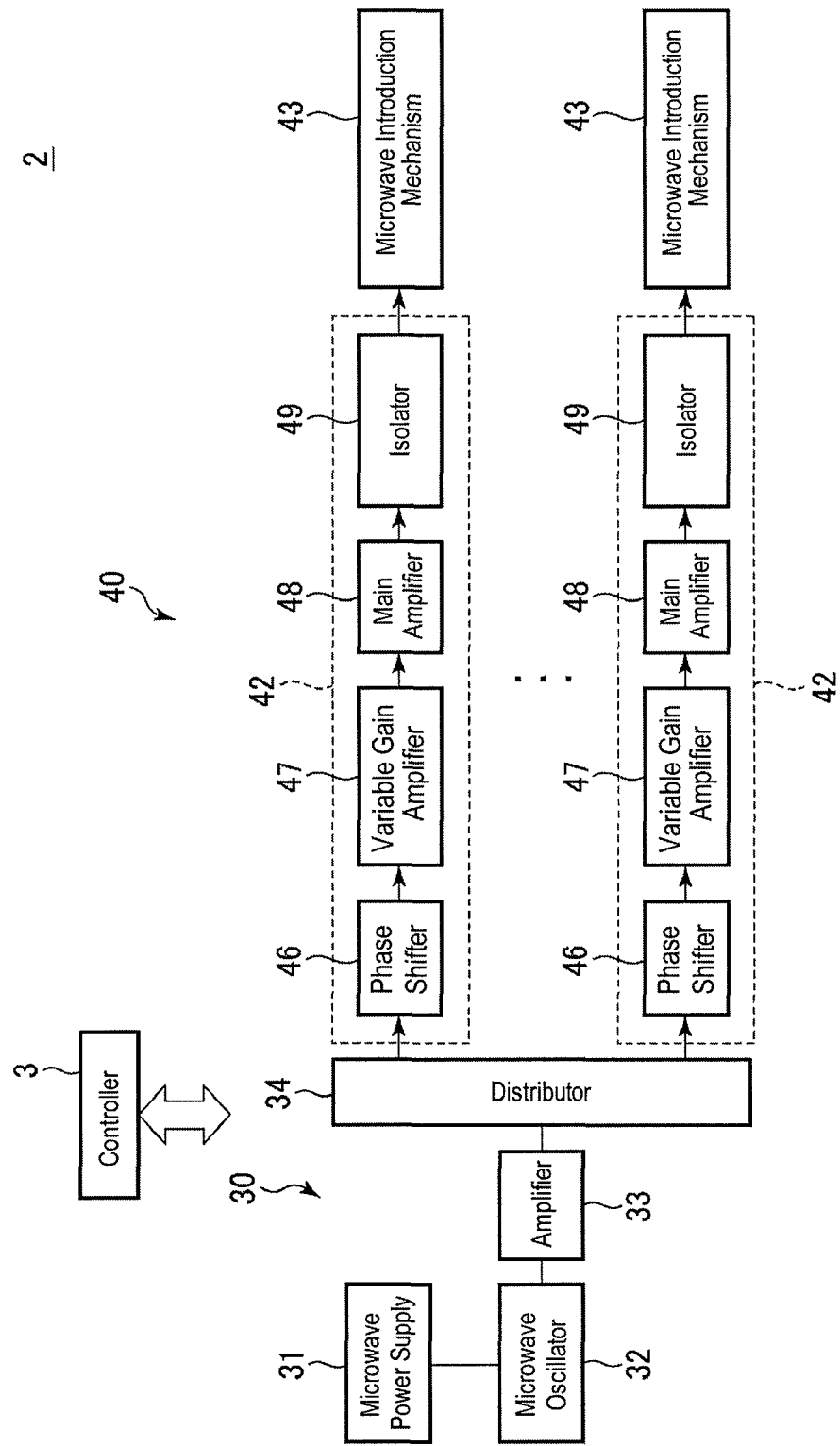
FIG. 3 is a block diagram showing a configuration of the microwave plasma source used in the plasma processing apparatus of FIG. 1.

FIG. 1 is a sectional view showing a schematic configuration of a plasma processing apparatus according to one embodiment of the present disclosure, FIG. 2 is a plan view schematically showing a microwave introduction mechanism in a microwave plasma source used in the plasma processing apparatus of FIG. 1, and FIG. 3 is a block diagram showing a configuration of the microwave plasma source.

The plasma processing apparatus 100 is implemented with, e.g., an apparatus for performing a film forming process or an etching process as a plasma processing for a wafer. The plasma processing apparatus 100 includes a grounded chamber 1 which is configured in an airtight manner and is made of metal such as aluminum, stainless steel or the like into a substantially cylindrical shape, and a microwave plasma source 2 for generating microwave plasma in the chamber 1. The chamber 1 has an opening 1a formed in the upper portion thereof and the microwave plasma source 2 is arranged to face the interior of the chamber 1 through the opening 1a.

In addition, the plasma processing apparatus 100 has a controller 3 including a microprocessor. The controller 3 serves to control various components of the plasma processing apparatus 100. The controller 3 includes a storage unit for storing process recipes, i.e., process sequences or control parameters of the plasma processing apparatus 100, an input means, a display and the like, so that predetermined control based on a selected process recipe can be executed.

In the chamber 1, a susceptor (mounting table) 11 for horizontally supporting a semiconductor wafer W (hereinafter, simply referred to as a wafer W) as an object to be processed is provided. The susceptor 11 is supported by a cylindrical supporting member 12 erected in the bottom center of the chamber 1 via an insulating member 12a. The susceptor 11 and the supporting member 12 are made of, for example, metal such as aluminum having an alumite-treated (anodized) surface, an insulating member (ceramics or the like) having high-frequency electrodes therein, or the like.

In addition, although not shown, the susceptor 11 is provided with an electrostatic chuck for attracting the wafer W electrostatically, a temperature control mechanism, a gas passage for supplying a heat transfer gas to the rear surface of the wafer W and elevating pins moving vertically to transfer the wafer W. In addition, the susceptor 11 is electrically connected with a high-frequency bias power supply 14 via a matching device 13. When high-frequency power is supplied from the high-frequency bias power supply 14 to the susceptor 11, ions in plasma are attracted to the wafer W side. Alternatively, the high-frequency bias power supply 14 may not be provided depending on characteristics of the plasma processing. In this case, an insulating member made of ceramics such as MN may be used as the susceptor 11.

A gas exhaust pipe 15 is connected to the bottom of the chamber 1 and a gas exhaust unit 16 including a vacuum pump is connected to the gas exhaust pipe 15. When the gas exhaust unit 16 is operated, the interior of the chamber 1 is evacuated and can be depressurized to a predetermined vacuum level at a high speed. In addition, on a side wall of the chamber 1 are provided a gate 17 for loading and unloading the wafer W and a gate valve 18 for opening and closing the gate 17.

The microwave plasma source 2 includes a microwave output unit 30 for outputting a microwave through a plurality of paths, and a microwave supply unit 40 for guiding the microwave output from the microwave output unit 30 into the chamber 1, and a microwave radiation plate (microwave radiation member) 50 which is air-tightly installed on a support ring 29 provided on an upper portion of the chamber 1 and formed in a shape of a circular plate for radiating the microwave supplied from the microwave supply unit 40 into the chamber 1. The microwave radiation plate 50 includes a slot antenna for radiating the microwave and a shower head for introducing a gas. The microwave radiation plate 50 constitutes the ceiling wall of the chamber 1, and has a peripheral part 50a in a circular ring shape corresponding to the peripheral portion in the chamber 1 and a central part 50b in a circular cylinder shape corresponding to the central portion in the chamber 1, which are detachably fixed to each other by screws.

The microwave supply unit 40 includes a plurality of amplifier parts 42, and a plurality of microwave introduction mechanisms 43 installed corresponding to the amplifier parts 42. As shown in FIG. 2, the microwave introduction mechanisms 43 are provided such that four of them are arranged on the peripheral part 50a of the microwave radiation plate 50 along the circumferential direction at equidistant intervals and one of them is on the central part 50b. In addition, the microwave supply unit 40 and the microwave radiation plate 50 will be described later in detail.

The microwave plasma source 2 further includes a gas supply source 110 that supplies a plasma generation gas for generating plasma and a processing gas for performing a film forming process or an etching process. A noble gas such as an Ar gas or the like may be appropriately used as the plasma generation gas. As the processing gas, various gases may be used depending on types of processing, for example, a film forming process, an etching process and so on.

As shown in FIG. 3, the microwave output unit 30 includes a microwave power supply 31, a microwave oscillator 32, an amplifier 33 for amplifying an oscillated microwave, and a distributor 34 for dividing up the amplified microwave into plural ones.

The microwave oscillator 32 performs, for example, a PLL (Phase-Locked Loop) oscillation on a microwave having a predetermined frequency (e.g., 915 MHz). The distributor 34 distributes the microwave amplified in the amplifier 33 while keeping the impedance at input and output sides to match so as to minimize the loss of the microwave. The microwave frequency ranging from 700 MHz to 3 GHz may be used, in addition to the microwave frequency of 915 MHz.

The plurality of amplifier parts 42 of the microwave supply unit 40 guide the microwaves divided in the distributor 34 to the microwave introduction mechanisms 43, respectively. Each one of the plurality of amplifier parts 42 includes a phase shifter 46, a variable gain amplifier 47, a main amplifier 48 forming a solid state amplifier, and an isolator 49.

The phase shifter 46 is configured to change the phase of the microwave, and radiation characteristics of the microwave can be modulated by controlling the phase shifter 46. For example, a plasma distribution can be changed by controlling the directivity by adjusting the phase of each antenna module. In addition, a circularly-polarized wave can be obtained by shifting the phase between adjacent antenna modules by 90 degrees. In addition, the phase shifter 46 can be used for spatial synthesis in a tuner by adjusting delay characteristics between components in each amplifier part 42. However, the phase shifter 46 is not necessary if the adjustment of the delay characteristics between the components in each amplifier part 42 and the modulation of the radiation characteristics of the microwave are not required.

The variable gain amplifier 47 is used to adjust plasma intensity by adjusting a power level of the microwave input to the main amplifier 48. It is also possible to adjust a plasma distribution by controlling the variable gain amplifier 47 for each antenna module.

The main amplifier 48 forming a solid state amplifier may be configured to include, for example, an input matching circuit, a semiconductor amplifying element, an output matching circuit and a high-Q resonance circuit.

The isolator 49 is used to separate a microwave reflected from the slot antenna described later and directed to the main amplifier 48, and includes a circulator and a dummy load (coaxial termination). The circulator guides the reflected microwave to the dummy load, and the dummy load converts the microwave guided by the circulator into heat.

The microwave introduction mechanism 43, as described later, has a function of transmitting the microwave output from the amplifier part 42 and an impedance matching function, and guides the microwave to the later-described slot antenna part of the microwave radiation plate 50.

The microwave radiation plate 50, as described later, radiates the microwaves that are guided from the above-described plurality of microwave introduction mechanisms 43, into the chamber 1 through the slot antenna part, and also guides the plasma generation gas or processing gas that is supplied from the gas supply source 110 through a gas supply pipe 111, into the chamber 1 through the shower head part. Accordingly, the surface wave plasma is generated in the chamber 1.

Next, the microwave radiation plate 50 will be described in detail.

Figure 4:
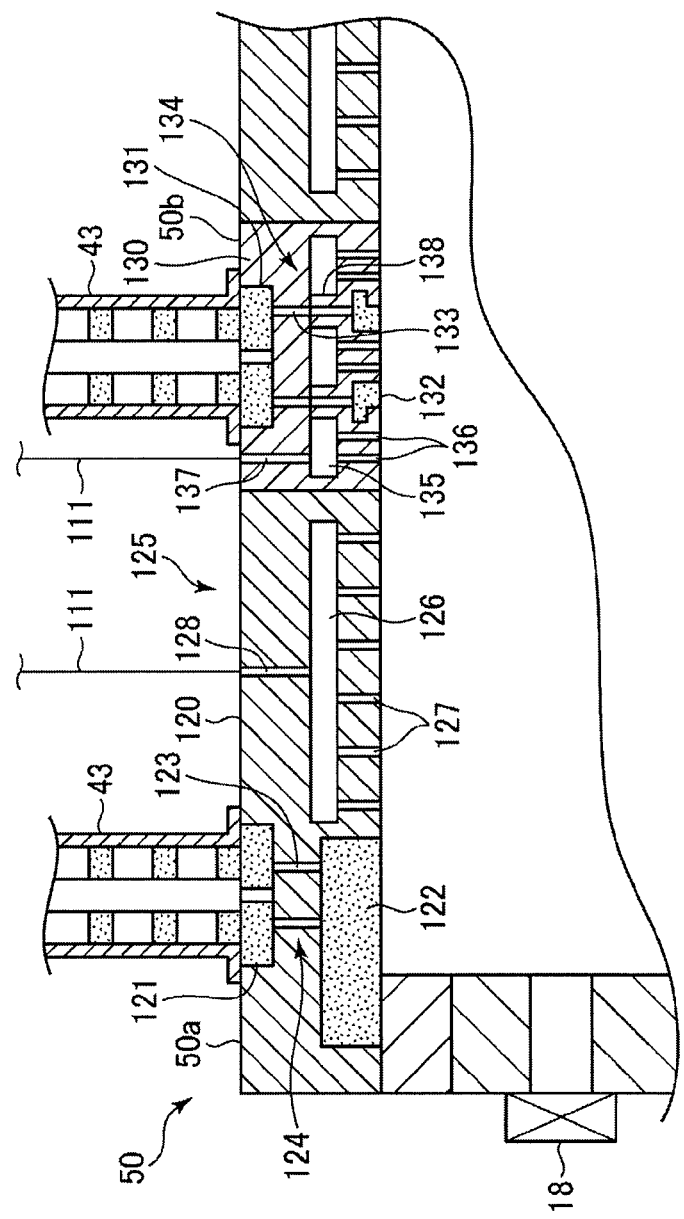
FIG. 4 is a sectional view showing a microwave radiation plate in the microwave plasma source of the plasma processing apparatus of FIG. 1.

FIG. 4 is a sectional view showing the microwave radiation plate 50. The microwave radiation plate 50, as described above, includes the peripheral part 50a corresponding to the peripheral portion in the chamber 1 and the central part 50b corresponding to the central portion in the chamber 1. In addition, the peripheral part 50a corresponds to a peripheral region of the wafer W and the central part 50b corresponds to a central region of the wafer W.

The peripheral part 50a includes a metal main body portion 120 in a circular ring shape as a whole. Retardation members 121 are fitted into the top surface of the main body portion 120 at positions corresponding to the four microwave introduction mechanisms 43, respectively. In addition, a microwave transmission member 122 is fitted into the bottom surface of the main body portion 120 to form a circular ring shape along the regions in which the four peripheral microwave introduction mechanisms 43 are arranged. In addition, a slot antenna part 124 having slots 123 is provided between the retardation members 121 and the microwave transmission member 122 of the main body portion 120 along the regions in which the four peripheral microwave introduction mechanisms 43 are arranged. In addition, a shower head part (shower structure) 125 configured to introduce the plasma generation gas or the processing gas into the chamber 1 in a shower form is defined at radially inner side than the slot antenna part 124 of the main body portion 120. The shower head part 125 includes a gas diffusion space 126 formed in a circular ring shape in a portion of the main body portion 120 positioned more radially inwardly than the slot antenna part 124, a plurality of gas discharge holes 127 extending from the gas diffusion space 126 to the bottom surface of the main body portion 120, and a gas introduction hole 128 extending from the top surface of the main body portion 120 to the gas diffusion space 126. The gas supply pipe 111 for supplying the gas from thegas supply source 110 is connected to the gas introduction hole 128.

The main body portion 120 is preferably formed of metal, such as aluminum or copper, having a high thermal conductivity.

The retardation member 121 has a dielectric constant higher than vacuum, and for example, is made of quartz, ceramics, a fluorine-based resin such as polytetrafluoroethylene or a polyimide-based resin. Since a microwave wavelength is lengthened in vacuum, the retardation member 121 serves to shorten the microwave wavelength, thereby making the antenna small. The microwave transmission member 122 is made of a dielectric material transmitting the microwave, for example, quartz, ceramics, a fluorine-based resin such as polytetrafluoroethylene or a polyimide-based resin.

The slots 123 of the slot antenna part 124 allow the microwave introduced from the microwave introduction mechanisms 43 to be radiated into the chamber 1. The slots 123 may be filled with a dielectric material. As the slots 123 are filled with a dielectric material, an effective wavelength of the microwave is shortened, thereby enabling the thickness of slots to be thin. The dielectric material for filling the slots 123 may include, for example, quartz, ceramics, a fluorine-based resin such as polytetrafluoroethylene or a polyimide-based resin.

Figure 5:
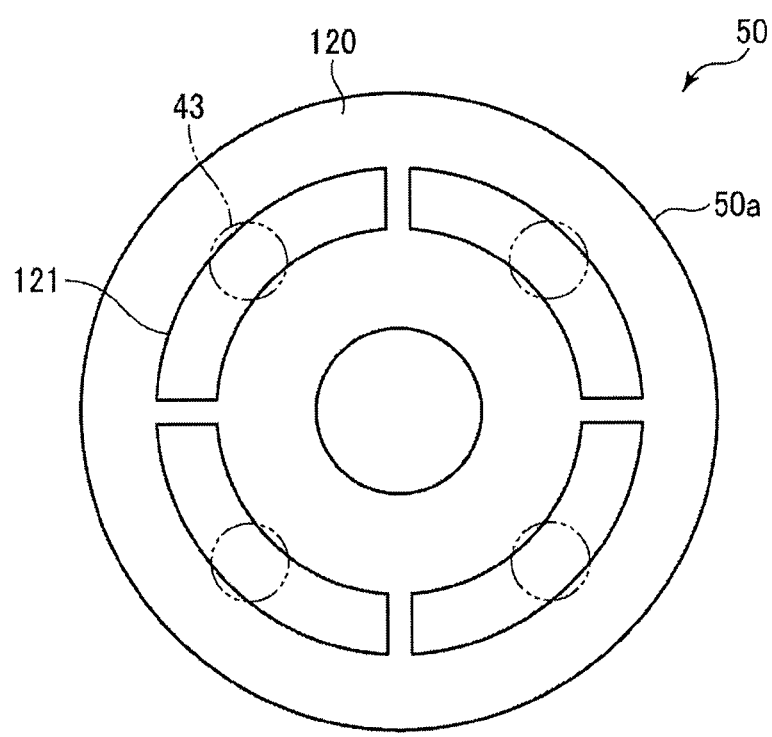
FIG. 5 is a plan view schematically showing a peripheral surface of a microwave radiation plate.

FIG. 5 is a plan view schematically showing a surface of the peripheral part 50*a*. As shown in FIG. 5, the four circular arc-shaped retardation members 121 are separately and concentrically installed on the surface of the peripheral part 50*a*, and the microwave introduction mechanism 43 is installed in the central part of each retardation member 121.

Figure 6:
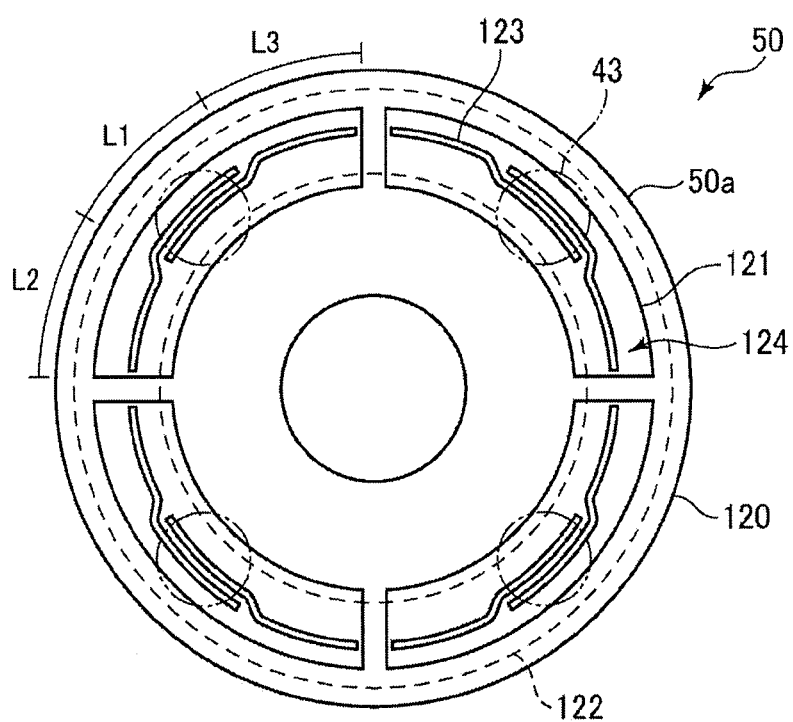
FIG. 6 is a view schematically showing a positional relationship between slots provided in slot antenna part, a microwave transmission member, retardation members, and peripheral microwave introduction mechanisms in a peripheral part of the microwave radiation plate.

In addition, FIG. 6 is a view schematically showing a positional relationship between the slots 123 provided in the slot antenna part 124, the microwave transmission member 122, the retardation members 121, and the peripheral microwave introduction mechanisms 43 in the peripheral part 50*a*. As shown in FIG. 6, the plurality of slots 123 are provided to form a circular shape as a whole interconnecting the regions in which the four peripheral microwave introduction mechanisms 43 are arranged, and the microwave transmission member 122 is provided to cover a region in which the slots 123 are arranged. In addition, the retardation members 121 are also provided along regions in which the slots 123 are arranged.

Each of the slots 123, as shown in FIG. 4, is provided to extend from the top surface of the main body portion 120 in contact with the retardation member 121 to the bottom surface of the main body portion 120 in contact with the microwave transmission member 122, and determines microwave radiation characteristics supplied from the four microwave introduction mechanisms 43 of the peripheral part 50*a*.

The peripheral portion of the slots 123 between the main body portion 120 and the microwave transmission member 122 is sealed by a seal ring (not shown). The microwave transmission member 122 seals the slots 123 by functioning as a vacuum seal. The slots 123 are arranged to form a circular shape as a whole along a circumferential direction defined by the regions in which the microwave introduction mechanisms 43 are arranged in order to promote dispersion of an electric field. In this example, as shown in FIG. 6, two slots 123 corresponding to each microwave introduction mechanism 43, i.e., the total eight slots 123, are arranged to form a circular shape as a whole. The two slots 123 corresponding to one microwave introduction mechanism 43 are shaped in a circular arc having an angle of about 90 degrees about the center of the microwave radiation plate 50 as a whole. An end portion of one slot and an end portion of the other slot overlap in a radial direction with each other in a region immediately below the microwave introduction mechanism 43. These two slots extend in the opposite circumferential directions, respectively, from that position. With this configuration, it is possible to appropriately disperse the electric field in the circumferential direction.

In some embodiments, the length of each slot 123 in the circumferential direction may be $(\lambda g/2) \pm \delta$. Where, $\lambda g$ is an effective wavelength of the microwave and $\delta$ is a fine tuning factor (including zero) used to increase uniformity of electric field intensity in the circumferential (or angular) direction. $\lambda g$ may be expressed by $4 = \lambda/\varepsilon s^{1/2}$. Where, $\varepsilon s$ is a dielectric constant of the dielectric material filled in the slot 123 and $\lambda$ is a wavelength of the microwave in vacuum. The length of the slot 123 is not limited to about $\lambda g/2$ and may be a value obtained by adding or subtracting the fine tuning factor (including zero) to or from an integer multiple of $\lambda g/2$. In addition, for the two slots 123 corresponding to one microwave introduction mechanism 43, in some embodiments, a length L1 of the region in which the two slots 123 overlap each other, a length L2 of one of non-overlapped regions, and a length L3 of the other of the non-overlapped regions be almost equal to one another. However, the shape of the slots 123 is not limited to that shown in FIG. 6 if they are provided along the circumferential direction and enable the microwave to be uniformly radiated.

The central part 50*b* is generally formed in a cylindrical shape as shown in FIG. 4, and includes a main body portion 130 made of metal. A circular retardation member 131 corresponding to the microwave introduction mechanism 43 is fitted in the center of the top surface of the main body portion 130. In addition, a microwave transmission member 132 is fitted in the bottom surface of the main body portion 130. Further, a slot antenna part 134 having slots 133 is provided between the retardation member 131 and the microwave transmission member 132 in the main body portion 130. In addition, a gas diffusion space 135 in the shape of a circular plate for constituting a shower head is provided within the main body portion 130. A plurality of gas discharge holes 136 are formed in the main body portion 130 under the gas diffusion space 135 to extend from the gas diffusion space 135 to the bottom surface of the main body portion 130. A gas introduction hole 137 is formed to extend from the top surface of the main body portion 130 to the gas diffusion space 135, and is connected to the gas supply pipe 111 for supplying the gas from the gas supply source 110. A surrounding member 138 for surrounding the slot 133 along the outline of the slot 133 is installed inside the gas diffusion space 135 in order to avoid interference between that the slot 133 and the gas supplied to the gas diffusion space 135.

In some embodiments, the main body portion 130 is formed of metal, such as aluminum or copper, having a high thermal conductivity.

The retardation member 131 has a dielectric constant higher than vacuum, and for example, is made of quartz, ceramics, a fluorine-based resin such as polytetrafluoroethylene or a polyimide-based resin. Since a microwave wavelength is lengthened in vacuum, the retardation member 131 shortens the microwave wavelength to serve to make the antenna small. The microwave transmission member 132 is made of a dielectric material transmitting the microwave, for example, quartz, ceramics, a fluorine-based resin such as polytetrafluoroethylene or a polyimide-based resin.

The slot antenna part 134 functions as a radiation antenna for radiating the microwave transmitted from the microwave introduction mechanism 43 into the chamber 1, and the microwave is radiated through the slots 133. The slots 133 may be filled with a dielectric material. As the slots 133 are filled with a dielectric material, an effective wavelength of the microwave is shortened, thereby enabling the thickness of slots to be thin. The dielectric material for filling the slots 133 may include, for example, quartz, ceramics, a fluorine-based resin such as polytetrafluoroethylene or a polyimide-based resin.

Figure 7:
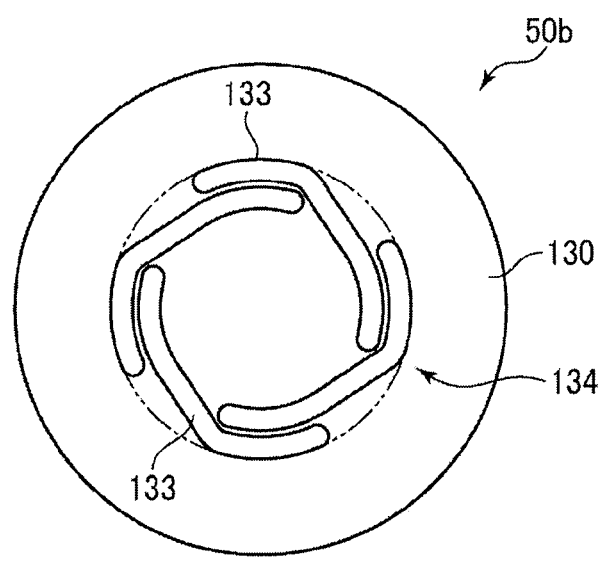
FIG. 7 is a plan view showing an example of a shape and an arrangement of the slots provided in a central part of the microwave radiation plate.

The shape of the slots 133, which determines microwave radiation characteristics of the microwave from the microwave introduction mechanism 43 corresponding to the central part 50b, is, for example, shaped as shown in FIG. 7. Specifically, four slots 133 are equally arranged to form a circular shape as a whole. These slots 133 have the same shape elongated along the circumference. These slots 133 are symmetrically arranged with respect to a point in the microwave radiation plane of the slot antenna part 134 corresponding to the central axis of the microwave introduction mechanism 43.

The length of each slot 133 in the circumferential direction is $(\lambda g/2)-\delta$ and is designed such that the peak of microwave electric field intensity is placed on the central position of the slot 133. Where, $\lambda g$ is an effective wavelength of the microwave and $\delta$ is a fine tuning factor (including zero) used to increase uniformity of the electric field intensity in the circumferential (or angular) direction. In addition, the length of the slot 133 is not limited to about $\lambda g/2$ and may be a value obtained by subtracting the fine tuning factor (including zero) from an integer multiple of $\lambda g/2$.

An overlap portion of two adjacent slots 133 is configured such that an end portion of one slot 133 and an end portion of the other slot 133 overlap with each other with a predetermined gap in the radial direction therebetween. In this configuration, there is no portion where no slot exists in the circumferential direction, which means the slots 133 are designed to obtain uniform radiation characteristics in the circumferential direction. Each slot 133 has a central portion, which does not overlap with other slots 133, and both end portions of each slot 133 overlap with other slots 133, respectively. One end portion of each slot 133 is disposed at radially inner side than an end portion of an adjacent slot while the other end portion of the slot is disposed at radially outer side than an end portion of an adjacent slot. In some embodiment, both end portions and the central portion of each slot 133 have approximately the same length. In addition, in some embodiments, the slots 133 are formed such that the inner circumferences of the slots 133 are distanced from the central point of the bottom surface of the central part 50b by $(\lambda g/4)\pm\delta'$ (where, $\delta'$ is a fine tuning factor (including zero) used to provide a uniform distribution of electric field intensity in the radial direction) or a value obtained by adding the fine tuning factor to an integer multiple of $\lambda g/4$.

In the slot antenna part 134 having the above-described configuration, since an end portion of a slot, which has low electric field intensity, is overlapped with an end portion of other slot, the electric field intensity at the end portions can be increased, which results in a uniform distribution of the electric field intensity in the circumferential (angular) direction.

Further, the number of slots corresponding to the microwave introduction mechanism 43 of the central part 50b is not limited to four but the same effects can be brought when three or five or more slots are used. In addition, the shape of the slots is not limited to that shown in FIG. 7. Instead, a plurality of arc-shaped slots that is evenly arranged on the circumference may be used.

Figure 8:
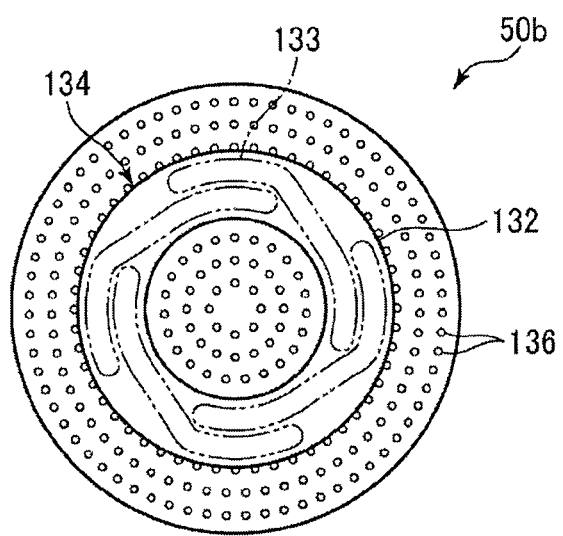
FIG. 8 is a bottom view illustrating the central part of the microwave radiation plate.

As shown in FIG. 8, the microwave transmission member 132 is provided in an annular shape in the bottom surface of the main body portion 130 such that the main body portion 130 includes (i.e., covers) a slot formation region where the slots 133 are formed. The peripheral portion of the slots 133 between the main body portion 130 and the microwave transmission member 132 is sealed by a seal ring (not shown). The microwave transmission member 132 seals the slots 133 by functioning as a vacuum seal.

In addition, although the microwave transmission member 132 is formed in the circular ring shape in FIG. 8, it may have a polygonal ring shape such as a triangular ring shape, a rectangular ring shape or the like.

Figure 9:
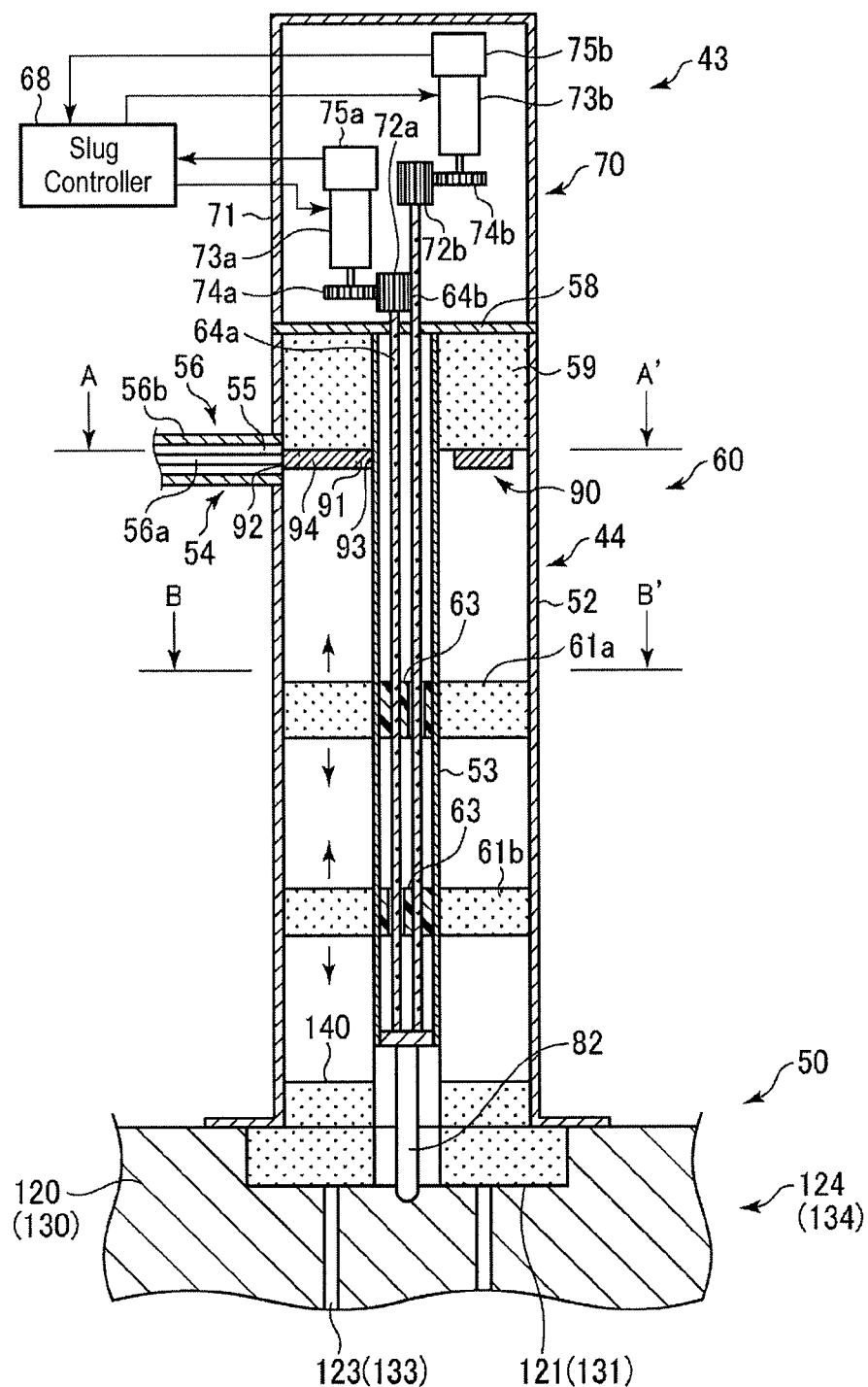
FIG. 9 is a sectional view showing the microwave introduction mechanism.
Figure 10:
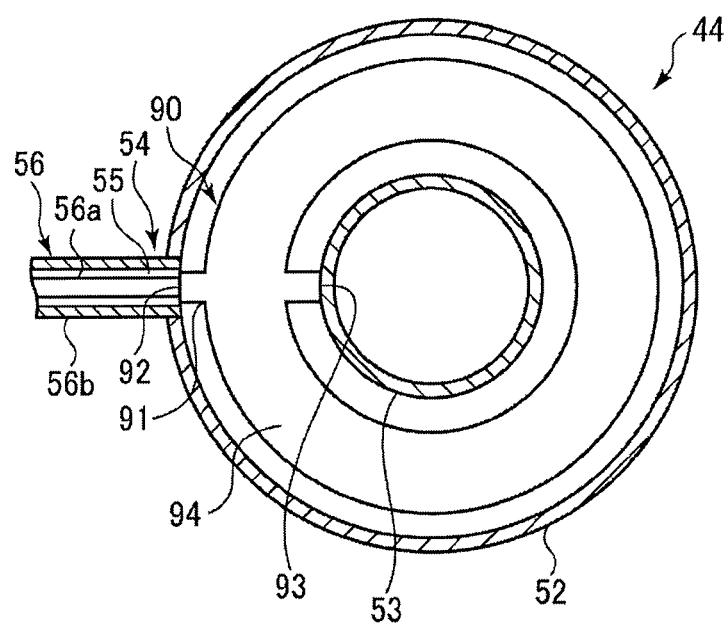
FIG. 10 is a transverse sectional view taken along line AA' in FIG. 9 showing a power feeding mechanism of the microwave introduction mechanism.
Figure 11:
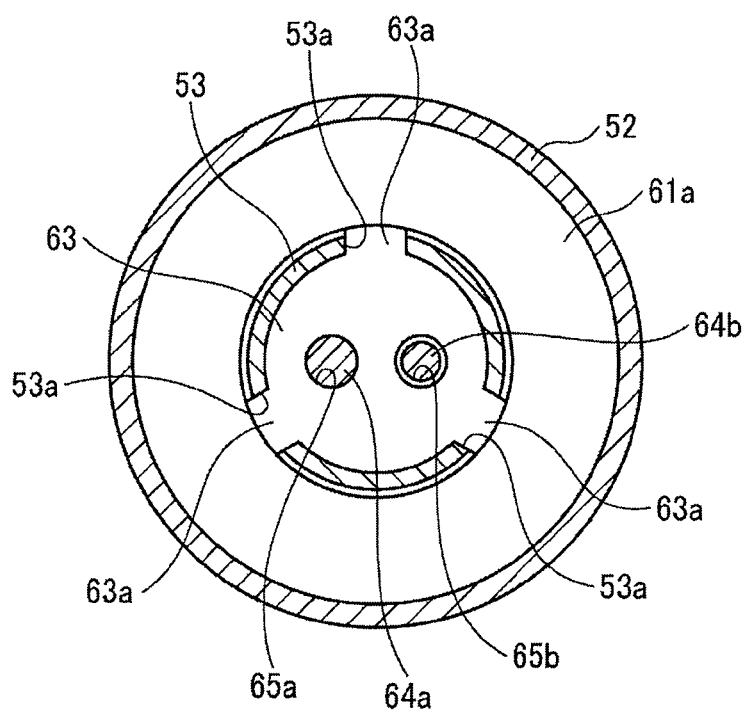
FIG. 11 is a transverse sectional view taken along line BB' of FIG. 9 showing a slug and a sliding member in a tuner of the microwave introduction mechanism.

Next, referring to FIGS. 9 to 11, the microwave introduction mechanism 43 will be described in detail. FIG. 9 is a sectional view showing the microwave introduction mechanism 43, FIG. 10 is a transverse sectional view taken along line AA' of FIG. 9 showing a power feeding mechanism of the microwave introduction mechanism 43, and FIG. 11 is a transverse sectional view taken along line BB' of FIG. 9 showing a slug and a sliding member in a tuner 60 of the microwave introduction mechanism 43.

As shown in FIG. 9, the microwave introduction mechanism 43 includes a coaxial-structured microwave transmission line (waveguide) 44 for transmitting a microwave, and a tuner 60 provided in the microwave transmission line 44. The microwave transmitted via the microwave transmission line 44 of the microwave introduction mechanism 43 is radiated into the chamber 1 through the slots corresponding to the microwave introduction mechanisms 43, respectively, and formed in the slot antenna part 124 or 134. Then, surface wave plasma is generated in the chamber 1 by the microwave.

The microwave transmission line 44 includes a cylindrical outer conductor 52 and a bar-shaped inner conductor 53 coaxially disposed in the center of the outer conductor 52. The microwave radiation plate 50 is connected at the leading end of the microwave transmission line 44.

In the microwave transmission line 44, the inner conductor 53 is fed with electric power and the outer conductor 52 is grounded. A reflection plate 58 is provided in the upper end of the outer conductor 52 and the inner conductor 53.

A power feeding mechanism 54 for feeding the microwave (electromagnetic wave) is provided in the base end of the microwave transmission line 44. The power feeding mechanism 54 has a microwave power inlet port 55 for introducing microwave power into the microwave transmission line 44. The microwave power inlet port 55 is provided on the lateral side of the microwave transmission line 44 (the outer conductor 52). The microwave power inlet port 55 is connected with a coaxial line 56 consisting of an inner conductor 56a and an outer conductor 56b. The coaxial line 56 acts as a power feeding line for feeding the microwave amplified by each amplifier part 42. The leading end of the inner conductor 56a of the coaxial line 56 is connected with a power feeding antenna 90 horizontally extending toward the interior of the outer conductor 52.

The power feeding antenna 90 is formed, for example, by machining a metal plate made of aluminum or the like and then fitting it into a dielectric frame made of Teflon (registered mark) or the like. Between the reflection plate 58 and the power feeding antenna 90, a retardation member 59 made of a dielectric such as Teflon or the like is provided to shorten the effective wavelength of a reflected wave. However, if a microwave having a high frequency such as 2.45 GHz or the like is used, the retardation member 59 may not be provided. At this time, the maximal electromagnetic wave can be transmitted into the coaxial-structured microwave transmission line 44 by optimizing a distance from the power feeding antenna 90 to the reflection plate 58 and reflecting the electromagnetic wave radiated from the power feeding antenna 90 by the reflection plate 58.

As shown in FIG. 10, the power feeding antenna 90 includes an antenna body 91, which is connected to the inner conductor 56a of the coaxial line 56 in the microwave power inlet port 55 and has a first electrode 92 fed therein with an electromagnetic wave and a second electrode 93 radiating therefrom the fed electromagnetic wave, and an annular reflector 94 extending from both sides of the antenna body 91 along the outer side of the inner conductor 53. With this configuration, the power feeding antenna 90 generates a standing wave by using an electromagnetic wave incident into the antenna body 91 and an electromagnetic wave reflected by the reflector 94. The second electrode 93 of the antenna body 91 is in contact with the inner conductor 53.

When the power feeding antenna 90 radiates the microwave (electromagnetic wave), microwave power is fed into a space between the outer conductor 52 and the inner conductor 53. Then, the microwave power fed by the power feeding mechanism 54 propagates toward the microwave radiation plate 50.

The tuner 60 matches the impedance of a load (plasma) within the chamber 1 to the characteristic impedance of the microwave power in the microwave output unit 30. The tuner 60 includes two slugs 61a and 61b vertically moving along the microwave transmission line 44 between the outer conductor 52 and the inner conductor 53 and a slug driving unit 70 provided in the outer side (upper side) of the reflection plate 58.

The slug 61a is provided in the side of slug driving unit 70 and the slug 61b is provided in the side of slot antenna part 124 or 134. In addition, two slug movement shafts 64a and 64b are provided in the inner space of the inner conductor 53. Each of the slug movement shafts 64a and 64b consists of a threaded rod on which, for example, a trapezoidal thread is formed along the longitudinal direction, so that the slugs 61a and 61b move along the slug movement shafts 64a and 64b.

As shown in FIG. 11, the slug 61a has an annular shape and is made of a dielectric material. A sliding member 63 made of slippery resin is fitted inside the slug 61a. The sliding member 63 is provided with a screw hole 65a in which the slug movement shaft 64a is screwed and a through hole 65b in which the slug movement shaft 64b is inserted. Like the slug 61a, the slug 61b has a screw hole 65a and a through hole 65b formed in a sliding member 63. However, contrary to the slug 61a, the screw hole 65a of the slug 61b is screwed with the slug movement shaft 64b and the slug movement shaft 64a is inserted in the through hole 65b of the slug 61b. With this configuration, the slug 61a moves vertically when the slug movement shaft 64a is rotated, and the slug 61b moves vertically when the slug movement shaft 64b is rotated. That is, the slugs 61a and 61b move vertically by a screw mechanism including the slug movement shafts 64a and 64b and the sliding members 63.

The inner conductor 53 has three slits 53a formed at equal intervals along the circumferential direction. On the other hand, the sliding member 63 has three projections 63a formed at equal intervals so as to correspond to the slits 53a. Under a state where the projections 63a are in contact with the inner circumference of the slugs 61a and 61b, the sliding members 63 are fitted in the slugs 61a and 61b. The outer circumferential surface of each sliding member 63 is in contact with the inner circumferential surface of the inner conductor 53 with no margin, and the sliding members 63 are adapted to be slid and move vertically along the inner conductor 53 when the slug movement shafts 64a and 64b are rotated. That is, the inner circumferential surface of the inner conductor 53 functions as a sliding guide of the slugs 61a and 61b.

The slug movement shafts 64a and 64b extend to the slug driving unit 70 through the reflection plate 58. Bearings (not shown) are interposed between the slug movement shafts 64a and 64b and the reflection plate 58.

The slug driving unit 70 has a housing 71. The slug movement shafts 64a and 64b extend into the housing 71, and gears 72a and 72b are installed on the upper ends of the slug movement shafts 64a and 64b, respectively. In addition, the slug driving unit 70 is provided with a motor 73a for rotating the slug movement shaft 64a and a motor 73b for rotating the slug movement shaft 64b. A gear 74a is installed on the shaft of the motor 73a and a gear 74b is installed on the shaft of the motor 73b. The gears 74a and 74b are adapted to engage with the gears 72a and 72b, respectively. Accordingly, the slug movement shaft 64a is rotated by the motor 73a via the gears 74a and 72a, while the slug movement shaft 64b is rotated by the motor 73b via the gears 74b and 72b. An example of the motors 73a and 73b may include a stepping motor.

The slug movement shaft 64b is longer than the slug movement shaft 64a, and thus, may be able to reach a position higher than the slug movement shaft 64a can. Therefore, the gears 72a and 72b are vertically offset from each other and the motors 73a and 73b are also vertically offset from each other. This configuration allows a driving power transmission mechanism including the gears 72a and 72b and the motors 73a and 73b to be accommodated in a small space. Accordingly, the housing 71 has the same diameter as that of the outer conductor 52.

On the motors 73a and 73b are respectively provided incremental encoders 75a and 75b which are directly connected to the output shafts of the motors 73a and 73b for detecting positions of the slugs 61a and 61b.

The positions of the slugs 61a and 61b are controlled by a slug controller 68. Specifically, based on an impedance value of an input terminal detected by an impedance detector (not shown) and position information of the slugs 61a and 61b detected by the encoders 75a and 75b, the slug controller 68 transmits control signals to the motors 73a and 73b and adjusts the impedance value by controlling the positions of the slugs 61a and 61b. The slug controller 68 executes an impedance matching such that a termination has, for example, 50 n. When only one of the slugs 61a and 61b is moved, a trajectory passing through the origin of the Smith chart is drawn. When both of the slugs 61a and 61b are simultaneously moved, a phase is rotated only.

An impedance adjustment member 140 is provided in the leading end of the microwave transmission line 44. The impedance adjustment member 140 may be made of a dielectric material, by the dielectric constant of which the impedance of the microwave transmission line 44 can be adjusted. A cylindrical member 82 is provided in the leading end of the microwave transmission line 44, and the cylindrical member 82 extends through the above-described retardation member 121 or retardation member 131 and is connected to the main body portion 120 of the peripheral part 50a or the main body portion 130 of the central part 50b. The retardation member 121 or 131 can adjust a phase of the microwave by the thickness thereof, and the thickness is adjusted such that the surface (microwave radiation plane) of the main body portion 120 or 130 is positioned to "antinode" of a standing wave. Accordingly, it is possible to minimize reflection and maximize radiation energy of the microwave.

In this embodiment, the main amplifier 48, the tuner 60, and the slot antenna part 124 or 134 of the microwave radiation plate 50 are arranged in proximity to one another. In addition, the tuner 60 and the slot antenna part 124 or 134 are arranged within a half wavelength distance to form a lumped constant circuit and the combined resistance of the slot antenna part 124 or 134 and the retardation member 121 or 131 is set to 50 n. Therefore, the tuner 60 directly tunes a plasma load, which can result in efficient transfer of energy to plasma.

<Operation of Plasma Processing Apparatus>

Hereinafter, an operation of the plasma processing apparatus 100 configured as above will be described.

First, a wafer W is carried into the chamber 1 and mounted on the susceptor 11. Then, while a plasma generation gas, for example, an Ar gas, is discharged into the chamber 1 from the gas supply source 110 through the gas supply pipe 111 and the microwave radiation plate 50, a microwave transmitted from the microwave output unit 30 of the microwave plasma source 2 through the plurality of amplifier parts 42 and the plurality of microwave introduction mechanisms 43 of the microwave supply unit 40 is radiated into the chamber 1 via the microwave radiation plate 50, thereby generating surface wave plasma on the surface of the microwave radiation plate 50. In the same manner as the above, a processing gas is also supplied from the gas supply source 110 to the gas supply pipe 111 and discharged into the chamber 1 via the microwave radiation plate 50. The processing gas is excited by the surface wave plasma and converted into plasma, and the wafer W is subjected to plasma processing, such as, a film forming process or an etching process, by the plasma of the processing gas.

Specifically, in the peripheral part 50a of the microwave radiation plate 50, the plasma generation gas and the processing gas are supplied to the shower head part 125 from the gas supply source 110 via the gas supply pipe 111, while in the shower head part 125, the plasma generation gas and the processing gas are diffused into the gas diffusion space 126 through the gas introduction hole 128 and discharged into the chamber 1 through the gas discharge holes 127. On the other hand, after the microwave power is oscillated by the microwave oscillator 32 of the microwave output unit 30 and amplified by the amplifier 33, the microwave power is divided into plural ones by the distributor 34 and then distributed through the amplifier parts 42 into the four microwave introduction mechanisms 43 provided in the peripheral part 50a. The microwave power fed into the four microwave introduction mechanisms 43 is transmitted to the microwave transmission lines 44 and introduced to the peripheral part 50a of the microwave radiation plate 50. The microwaves introduced from the microwave introduction mechanisms 43 penetrates the retardation members 121 and are radiated into the chamber 1 through the slots 123 of the slot antenna part 124 and the microwave transmission member 122. Then, a surface wave is formed in the bottom surface of the microwave transmission member 122 and the main body portion 120, and the surface wave plasma is generated immediately below the peripheral part 50a in the chamber 1 by the surface wave.

In this way, since the four microwave introduction mechanisms 43 are provided in the peripheral part 50a of the microwave radiation plate 50 along the circumferential direction and the microwaves introduced from the four microwave introduction mechanisms 43 are radiated from the slots 123 provided along the circumferential direction defined by the region in which the microwave introduction mechanisms 43 are arranged, the electric field intensity can be dispersed. Further, since the microwave transmission member 122 is provided to cover the slots 123 along the circumferential direction defined by the region in which the microwave introduction mechanisms 43 are arranged, the surface wave can be expanded in the bottom surface of the microwave transmission member 122. With such a configuration, the surface wave plasma can be expanded in the position corresponding to the peripheral portion of the wafer W, thereby enabling uniformly generated plasma along the circumferential direction. In addition, since the plasma can be expanded in such a manner, it is possible to reduce the necessary number of the microwave introduction mechanisms 43 and therefore to reduce the apparatus cost.

Particularly, in this embodiment, two slots 123 are provided corresponding to each microwave introduction mechanism 43. In the two slots 123 corresponding to one of the microwave introduction mechanisms 43, an end portion of one slot and an end portion of the other slot overlap in the radial direction with each other in the region immediately below the microwave introduction mechanism 43, and these slots extend from the region immediately below the microwave introduction mechanism 43 in opposite circumferential directions, respectively. Thus, a strong electric field can be prevented from being concentrated only in the vicinity of the microwave introduction mechanisms 43, thereby appropriately dispersing the electric field intensity in the circumferential direction. Further, a problem that a microwave from one of the microwave introduction mechanisms 43 comes to infiltrate into the other microwave introduction mechanisms 43 does not occur.

Figure 12:
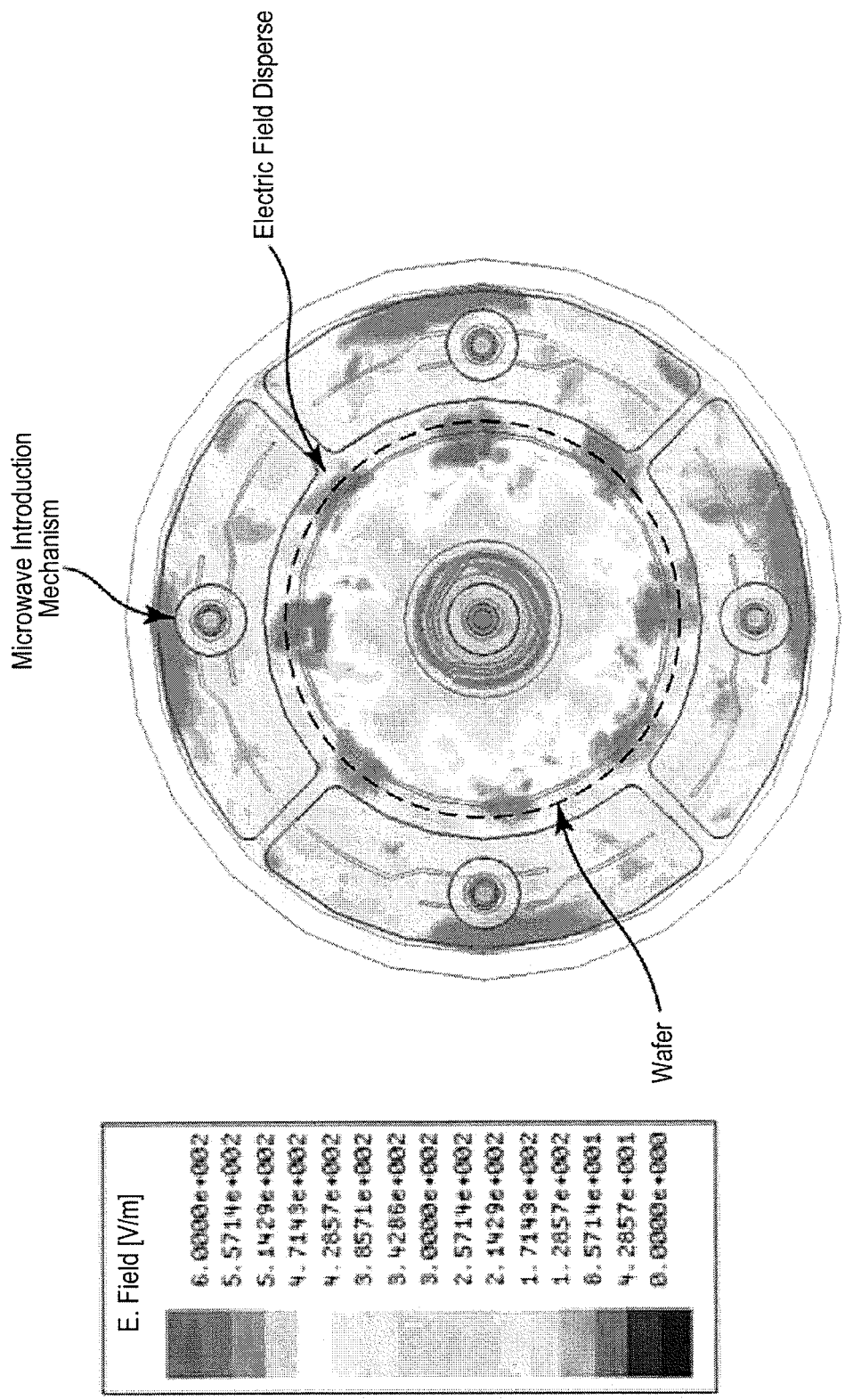
FIG. 12 is a view showing a result of an electronic simulation when the slots having a shape shown in FIG. 6 are provided.

FIG. 12 shows an electronic simulation result when the slots having the shape shown in FIG. 6 are formed. It can be seen from FIG. 12 that a strong electric field is dispersed, so that it is shown not only in the regions immediately below the microwave introduction mechanisms 43 but also in other regions.

In addition, since the microwave transmission member 122 is provided to form a circular ring shape along the four microwave introduction mechanisms 43 arranged in the peripheral part 50a, the shower head part 125 can be provided over a wide range of portions positioned radially inner side of the microwave transmission member 122. For this reason, it is possible to uniformly introduce the plasma generation gas or the processing gas onto the wafer W without positionally interfering with the radiated microwave. In addition, as the gas is introduced from the ceiling of the chamber 1, the flow direction of the gas can be allowed to be the same as the radiation direction of the microwave, thereby effectively converting the gas into plasma.

On the other hand, in the central part 50b of the microwave radiation plate 50, the gas is supplied to the gas diffusion space 135 from the gas supply source 110 through the gas supply pipe 111 and the gas introduction hole 137 and diffused in the gas diffusion space 135, and then discharged into the chamber 1 through the gas discharge holes 136. On the other hand, the microwave power is fed into the microwave introduction mechanism 43 provided in the central part 50*b* in the same manner as the microwave introduction mechanisms 43 of the peripheral part 50*a*, and the microwave is introduced from the microwave introduction mechanism 43 into the central part 50*b* of the microwave radiation plate 50. The microwave introduced from the microwave introduction mechanism 43 penetrates the retardation member 131 and is radiated into the chamber 1 through the slots 133 of the slot antenna part 134 and the microwave transmission member 132, thereby generating surface wave plasma in the chamber 1 immediately below the central part 50*b*.

Even in the central part 50*b*, the flow direction of the gas can be allowed to be the same as the radiation direction of the microwave, thereby effectively converting the gas into plasma. In addition, since the gas diffusion space 135 or the gas discharge holes 136 are separated from the slots 133 transmitting the microwave, a problem that the gases are unwantedly converted to plasma during passing through them does not occur. In addition, since the microwave transmission member 132 is provided to include (i.e., cover) the slot formation region, the plasma can be uniform even in the region immediately below the central part 50*b*.

<Another Embodiment>

Figure 13:
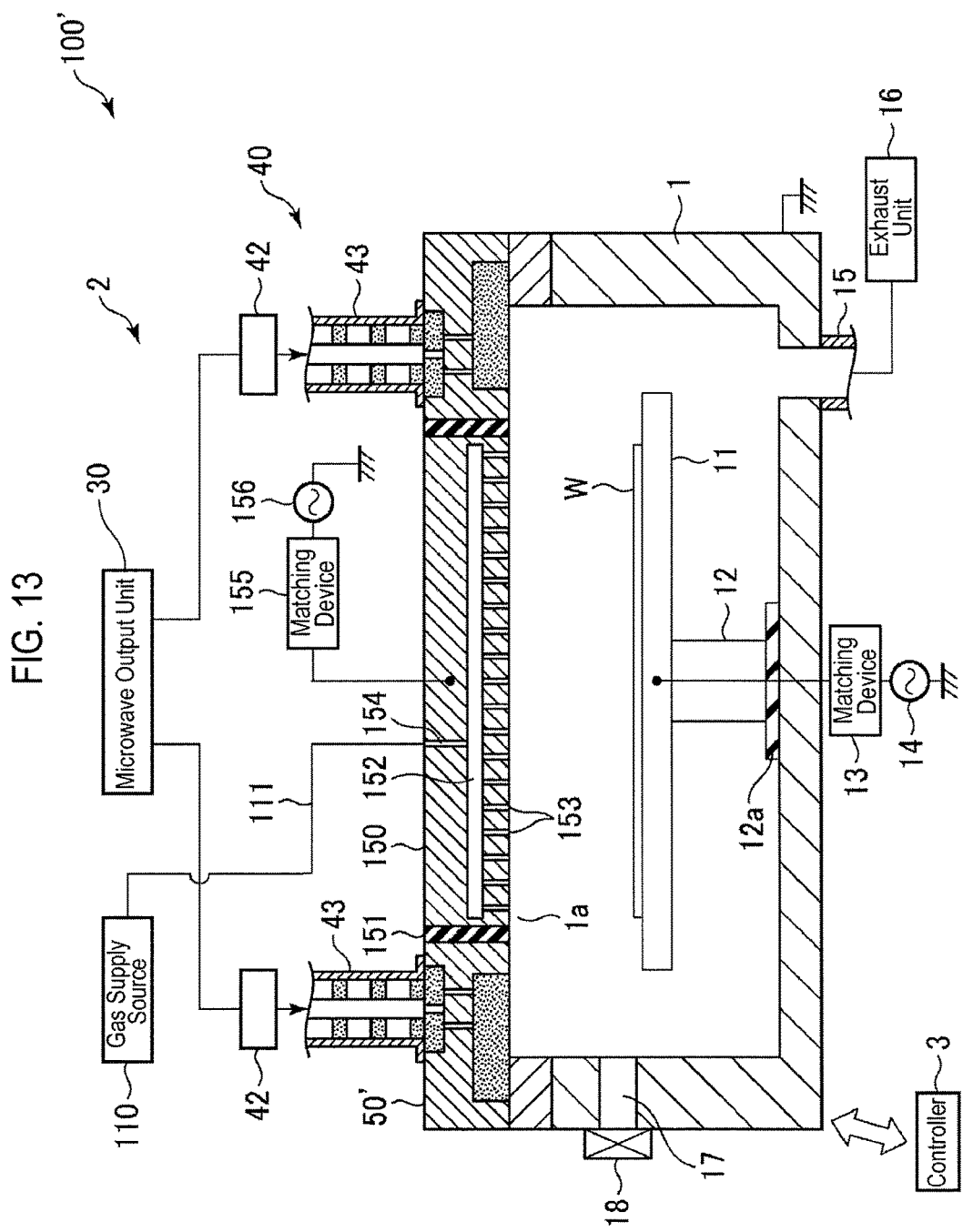
FIG. 13 is a sectional view showing a schematic configuration of a plasma processing apparatus according to another embodiment of the present disclosure.

In the above-described embodiment, the microwave introduction mechanism 43 is provided in the central part of the microwave radiation plate 50, whereby the surface wave plasma is generated even at the portion corresponding to the central region of the wafer W in the chamber 1. However, since the main point of the present disclosure is to generate uniform plasma in the peripheral portion, the configuration of the central part is not limited to the above described embodiment. In another embodiment of the present disclosure, the central part may have a configuration for generating capacitive coupling plasma. FIG. 13 is a sectional view showing a general configuration of a plasma processing apparatus according to another embodiment of the present disclosure.

As shown in FIG. 13, in a plasma processing apparatus 100' of the embodiment, the microwave supply unit 40 has only four peripheral microwave introduction mechanisms 43, an annular microwave radiation plate 50' including the region in which the microwave introduction mechanisms 43 are arranged is provided instead of the microwave radiation plate 50 of FIG. 1, and a conductive shower head 150 having almost the same size as the wafer W is provided in the central portion of a radially inner side of the annular microwave radiation plate 50' with an insulating member 151 interposed therebetween. The shower head 150 includes a gas diffusion space 152 in the shape of a circular plate, a plurality of gas discharge holes 153 formed to extend from the gas diffusion space 152 to the chamber 1, and a gas introduction hole 154 for introducing a gas from the gas supply pipe 111 into the gas diffusion space 152. The shower head 150 is electrically connected to a high-frequency power supply 156 for generating plasma via a matching device 155. The susceptor 11 has a conductive portion, which functions as a counter electrode of the shower head 150. As high-frequency power is supplied to the shower head 150 from the high-frequency power supply 156, a high-frequency electric field is generated between the shower head 150 and the susceptor 11, and capacitive coupling plasma is generated in a space immediately above the wafer W. The central portion has the same configuration as that of a plasma etching apparatus for performing a plasma etching process on a wafer. The plasma processing apparatus 100' having this configuration may be used, for example, as a plasma etching apparatus in which a plasma density at the peripheral portion of the wafer is adjusted by surface wave plasma using a microwave. In FIG. 13, the same reference numerals are also used to designate the same elements as those of FIG. 1, the description of which will be omitted.

<Other Applications>

Hereinabove, while the embodiments of the present disclosure have been described with reference to the accompanying drawings, the present disclosure is not limited to the above-described two embodiments, but various modifications can be made within the scope of the spirit of the present disclosure. For example, since the main point of the present disclosure is to generate uniform plasma in the peripheral portion, the configuration of the central part is not limited to the above-described two embodiments, but a variety of configurations may be taken according to a desired plasma distribution. The mechanism for generating plasma in the central part may not be provided.

In addition, while it has been described as an example in the above-described embodiments that the four microwave introduction mechanisms 43 are provided along the circumferential direction on the peripheral part 50*a* of the microwave radiation plate 50, the number of the microwave introduction mechanisms 43 in the peripheral part is not limited to four but may be two or more, and the number may be appropriately set such that the effects of the present disclosure are obtained.

Further, the configuration or the like of the microwave output unit 30 or the microwave supply unit 40 is not limited to that of the above embodiments. For example, the phase shifter 46 is not necessary if there is no need to control the directionality of a microwave radiated from the slot antenna part or render the microwave into circular polarization. In addition, the retardation member is not essential.

In addition, although a film forming apparatus and an etching processing apparatus are illustrated as the plasma processing apparatus in the above embodiments, the present disclosure is not limited thereto but may be applied to different plasma processing such as an oxynitride film forming process including nitridation and oxidation, an ashing process and the like. Further, the object to be processed is not limited to the semiconductor wafer W but may be other substrates such as an FPD (Flat Panel Display) substrate which is represented by an LCD (Liquid Crystal Display) substrate, a ceramic substrate and the like.

According to the present disclosure, microwave introduction mechanisms are arranged along the circumferential direction, a plurality of slots for radiating a microwave are provided to form a circular shape as a whole along the regions in which the microwave introduction mechanisms are arranged, and a microwave transmission member for transmitting the microwave radiated from the slots is provided to form a circular ring shape along the regions in which the microwave introduction mechanisms are arranged while covering the slots. Thus, it is possible to disperse electric field intensity and expand surface wave plasma. Accordingly, it is possible to generate uniform plasma along the circumferential direction. In addition, since the plasma can be expanded like this, the necessary number of the microwave introduction mechanisms can be reduced, thereby enabling the apparatus cost to be reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A microwave plasma source that radiates a microwave in a chamber of a plasma processing apparatus to generate surface wave plasma, the microwave plasma source comprising:
   a microwave output unit configured to generate and output a microwave;
   a microwave supply unit configured to transmit the microwave output from the microwave output unit; and
   a microwave radiation member configured as a ceiling wall of the chamber and configured to radiate the microwave supplied from the microwave supply unit into the chamber, the microwave radiation member being a metal plate airtightly installed over a sidewall of the chamber,
   wherein the microwave supply unit includes a plurality of microwave introduction mechanisms provided on a top surface of a peripheral portion of the microwave radiation member along a circumferential direction, thereby introducing the microwave to the microwave radiation member, and
   wherein the microwave radiation member includes:
   a plurality of arc-shaped retardation members fitted into an upper portion of the microwave radiation member, each of the plurality of retardation members being disposed at a position which is located within the microwave radiation member, and located below each of the plurality of microwave introduction mechanisms to shorten a wavelength of the microwave, wherein each of the plurality of microwave introduction mechanisms is installed in the central part of the corresponding arc-shaped retardation member;
   a slot antenna part having a plurality of slots through which the microwave is radiated, formed corresponding to each microwave introduction mechanism, the plurality of slots extending circumferentially beyond regions that are immediately below the corresponding microwave introduction mechanisms, and the plurality of slots being provided and extending in the peripheral portion of the microwave radiation member to form a circular shape as a whole along the peripheral portion of the microwave radiation member; and
   a microwave transmission member fitted into a bottom portion of the microwave radiation member, having a circular ring shape, provided in the peripheral portion of the microwave radiation member along a circumferential direction to cover the plurality of slots, and made of a dielectric material transmitting the microwave radiated from the plurality of slots,
   wherein the plurality of slots is interposed between the retardation members and the microwave transmission member.

2. The microwave plasma source of claim 1, wherein the microwave radiation member further includes a shower structure provided in a radially inner side portion than the slot antenna part, the shower structure being configured to introduce a gas used in plasma processing into the chamber in a shower form.

3. The microwave plasma source of claim 1, wherein the microwave radiation member is shaped in a circular plate and further includes a microwave introduction mechanism arranged at a position corresponding to a central portion in the chamber in order to generate surface wave plasma in the central portion in the chamber from the center of microwave radiation member.

4. The microwave plasma source of claim 1, wherein two slots of the plurality of slots are provided corresponding to one of the microwave introduction mechanisms, one end portion of one slot of the two slots overlapping one end portion of the other slot of the two slots in a radial direction with each other in a first region immediately below the microwave introduction mechanism, the other end portion of the one slot and the other end portion of the other slot existing in a second region which is not immediately below the microwave introduction mechanism and extending from the first region immediately below the microwave introduction mechanism in opposite circumferential directions, respectively.

5. A plasma processing apparatus, comprising:
   a chamber configured to accommodate a substrate to be processed;
   a gas supply mechanism configured to supply a gas into the chamber; and
   a microwave plasma source configured to radiate a microwave in the chamber to generate surface wave plasma, wherein plasma processing is performed on the substrate to be processed by the surface wave plasma,
   wherein the microwave plasma source comprises:
   a microwave output unit configured to generate and output a microwave;
   a microwave supply unit configured to transmit the microwave output from the microwave output unit; and
   a microwave radiation member configured as a ceiling wall of the chamber and configured to radiate the microwave supplied from the microwave supply unit into the chamber, the microwave radiation member being a metal plate airtightly installed over a sidewall of the chamber,
   wherein the microwave supply unit includes a plurality of microwave introduction mechanisms provided on a top surface of a peripheral portion of the microwave radiation member along a circumferential direction, thereby introducing the microwave to the microwave radiation member, and
   wherein the microwave radiation member includes:
   a plurality of arc-shaped retardation members fitted into an upper portion of the microwave radiation member, each of the plurality of retardation members being disposed at a position which is located within the microwave radiation member located below each of the plurality of microwave introduction mechanisms to shorten a wavelength of the microwave, wherein each of the plurality of microwave introduction mechanisms is installed in the central part of the corresponding arc-shaped retardation member;
   a slot antenna part having a plurality of slots through which the microwave is radiated, formed corresponding to each microwave introduction mechanism, the plurality of slots extending circumferentially beyond regions that are immediately below the corresponding microwave introduction mechanisms, and the plurality of slots being provided and extending in the peripheral portion of the microwave radiation member to form a circular shape as a whole along the peripheral portion of the microwave radiation member; and
   a microwave transmission member fitted into a bottom portion of the microwave radiation member, having a circular ring shape, provided in the peripheral portion of the microwave radiation member along a circumferential direction to cover the plurality of slots and made of a dielectric material transmitting the microwave radiated from the plurality of slots, wherein the plurality of slots is interposed between the retardation members and the microwave transmission member.

6. The plasma processing apparatus of claim 5, wherein the microwave radiation member further includes a shower structure provided in a radially inner side portion than the slot antenna part, the shower structure being configured to introduce a gas used in plasma processing into the chamber in a shower form.

7. The plasma processing apparatus of claim 5, wherein the microwave radiation member is shaped in a circular plate and further includes a microwave introduction mechanism arranged at a position corresponding to a central portion in the chamber in order to generate surface wave plasma in the central portion in the chamber from the center of microwave radiation member.

8. The plasma processing apparatus of claim 5, wherein the microwave radiation member is shaped in a circular ring corresponding to a peripheral portion in the chamber, wherein the plasma processing apparatus further comprises:

a mounting table configured to mount the substrate to be processed;

a shower head provided in a radially inner side portion of the microwave radiation member and configured to introduce a gas used in plasma processing into the chamber in a shower form; and a high-frequency electric field generating mechanism configured to generate a high-frequency electric field between the shower head and the mounting table, and wherein the high-frequency electric field generating mechanism generates capacitive coupling plasma in the chamber.

9. The plasma processing apparatus of claim 5, wherein two slots of the plurality of slots are provided corresponding to one of the microwave introduction mechanisms, one end portion of one slot of the two slots overlapping one end portion of the other slot of the two slots in a radial direction with each other in a first region immediately below the microwave introduction mechanism, the other end portion of the one slot and the other end portion of the other slot existing in a second region which is not immediately below the microwave introduction mechanism and extending from the first region immediately below the microwave introduction mechanism in opposite circumferential directions, respectively.

* * * * *